(12) United States Patent
Wang et al.

(10) Patent No.: US 6,466,034 B1
(45) Date of Patent: Oct. 15, 2002

(54) TRANSFORMER WINDING MOVEMENT DETECTION BY HIGH FREQUENCY INTERNAL RESPONSE ANALYSIS

(75) Inventors: Meng-Guang Wang, Surrey (CA); Adolph John Vandermaar, Maple Ridge (CA)

(73) Assignee: Powertech Labs Inc., Surrey (CA)

( * ) Notice: Subject to any disclaimer, the term of this patent is extended or adjusted under 35 U.S.C. 154(b) by 0 days.

(21) Appl. No.: 09/870,031

(22) Filed: May 29, 2001

(51) Int. Cl.$^7$ .............................................. G01R 31/06
(52) U.S. Cl. .......................... 324/547; 324/527; 361/38
(58) Field of Search ................................ 324/547, 522, 324/546, 552, 529, 530, 527, 521; 361/38

(56) References Cited

U.S. PATENT DOCUMENTS

| | | | |
|---|---|---|---|
| 3,728,619 A | * | 4/1973 | Harrold et al. .............. 324/521 |
| 4,857,856 A | | 8/1989 | Coleman et al. |
| 5,396,172 A | | 3/1995 | Lat et al. |
| 6,369,582 B2 | * | 4/2002 | Coffeen ....................... 324/547 |

OTHER PUBLICATIONS

Vladimir Ruschinsky, "Developing Hardware, Software and Methodical Support for Diagnostics of High–Power Transformer Windings without their Disassembly", undated International Science & Technology Centre (Moscow, RU) Project 1873 summary report published at http://www.ist-c.ru/istc/db/projects.nsf/prjn/1873, 5/01.
Denis, R.J. et al, "Comparison of Two FRA Methods to Detect Transformer Winding Movement", EPRI Substation Equipment Diagnostics Conference VIII, Feb. 20–23, 2000.
Dick, E.P., Erven, C.C., "Transformer Diagnostic Testing by Frequency Response Analysis", IEEE Transactions on Power Apparatus and Systems, vol. PAS–97, No. 6, pp. 2144–2153, Nov./Dec. 1978.
Feser, K., et al., "The Transfer Function Method for Detection of Winding Displacements on Power Transformers After Transport, Short Circuit or 30 Years of Service", CIGRE Session 2000 12/33–04.
Gillies, D.A., Humbard, L.E., Rogers, E.J., "Bonneville Power Administration Transformer Short Circuit Test Results —Comparison of Winding Inspection with Diagnostic Methods", IEEE PES Summer Meeting, San Francisco, CA, Paper T 72 597–3, Jul. 9–14, 1972.
Hanique, E., Reijnders, H.F., and Vaessen, P.T.M., "Frequency Response Analysis as a Diagnostic Tool", Journal of Elektrotechniek, vol. 68, No. 6, pp. 549–558, Jun. 1990.
Jarman, P.N., Lapworth, J.A., "Transformer Winding Movement and Fault Detection By Frequency Response Measurement", The 7th International Electrical Insulation Conference, Brighton, UK. May 94.
Rogers, E.J., Humbard, L.E., and Gillies, D.A., "Instrumentation Techniques for Low Voltage Impulse Testing of Power Transformers", IEEE Transactions of Power Apparatus and Systems, vol. PAS–91 No. 3, May–Jun. 1972.
Wang, M., Vandermaar, A.J., Srivastava, KD, "Condition Monitoring of Transformers in Service by the Low Voltage Impulse Test Method", 11th International Symposium on High Voltage Engineering, Aug. 22–27, 1999, 1.45.S3, ISH99.

* cited by examiner

*Primary Examiner*—N. Le
*Assistant Examiner*—Vincent Q. Nguyen
(74) *Attorney, Agent, or Firm*—Oyen Wiggs Green & Mutala (57) ABSTRACT

Transformer winding movement is detected by providing an input sensor inside the transformer on an input winding lead and providing an output sensor inside the transformer on an output winding lead. This eliminates the frequency limitation imposed by the lead lengths required for prior art external measurement, making it possible to obtain useful measurements at much higher frequencies (20 MHz) than with the prior art techniques.

33 Claims, 9 Drawing Sheets

TRANSFORMER WINDING MOVEMENT DETECTION BY HIGH FREQUENCY INTERNAL RESPONSE ANALYSIS

TECHNICAL FIELD

This invention pertains to a highly sensitive method of detecting small deformation or movement of the windings of a high voltage transformer over a broader frequency range (1 kHz to 20 MHz) than prior art techniques (which are typically restricted a frequency range of about 1 kHz to 3 MHz), without requiring external leads or removal of the transformer from service.

BACKGROUND

High voltage power transformers (i.e. 50 or 60 Hz oil-filled transformers with primary voltages ranging from 69 kV to 750 kV and ratings from 5 kVA to over 500 MVA) are the most expensive pieces of equipment in a typical interconnecting power system. Keeping such transformers in service is critical to the operation of the power system. Transformers normally operate quite reliably over their typical 30 year design life spans. However, transformer failures do sometimes occur, with consequential severe impacts including loss of service and resultant loss of revenue; equipment damage which can be very expensive to repair or replace; and, potentially serious explosion, fire or other safety hazards to utility operations personnel.

It is well known that movement, looseness, deformation or distortion of a transformer's windings can lead to catastrophic electrical or mechanical failure of the transformer. A transformer's windings may move, etc. if the transformer is subjected to an electrical short circuit, which is not uncommon. Furthermore, as a transformer ages, the paper insulation material applied to the transformer's windings tends to shrink, thereby reducing the overall winding clamping pressure and allowing the windings to move, etc. It is very difficult to reliably detect small movement, etc. of a transformer's windings, yet early and reliable detection of such conditions is highly desirable in order to avoid the aforementioned catastrophic consequences.

The conventional prior art method of detecting movement, etc. of a transformer's windings is to remove the transformer from service, open the transformer, and visually inspect the windings. The transformers in question are normally oil-filled, so it is necessary to drain the oil to facilitate inspection, and replace the oil after inspection. This is very time consuming, requires a long transformer outage interval and is quite expensive.

Another prior art method of detecting movement, etc. of a transformer's windings is the so-called "transformer short circuit impedance test". However, this technique requires a relatively large AC power source which is usually unavailable at the site of the transformer to be tested. Moreover, measurements of a transformer's short circuit impedance at the frequencies of interest (i.e. the transformer's normal 50 or 60 Hz operating frequency) are insufficiently sensitive to detect small winding deformation or movement, etc. and even less sensitive to detection of winding looseness.

Figure 1:
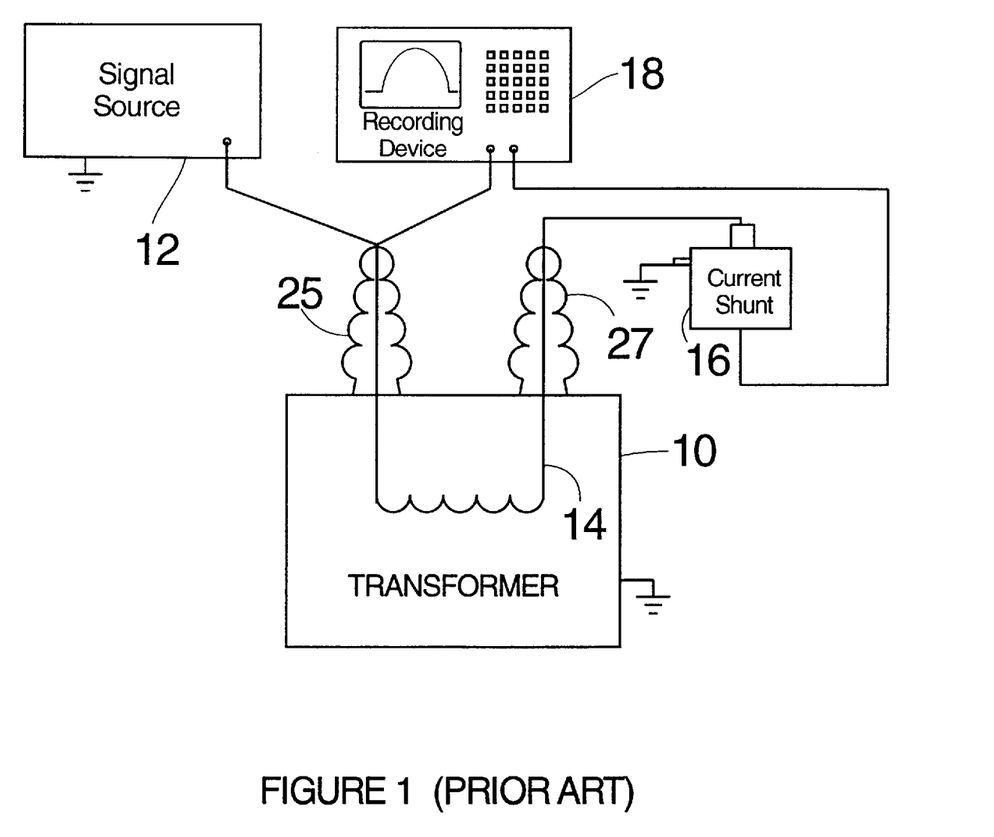
FIG. 1 is a block diagram showing a transformer configured for testing in accordance with a prior art frequency response analysis or low voltage impulse test.

The prior art has evolved an alternative "frequency response analysis" or "low voltage impulse" testing technique, which is considerably more sensitive to the detection of transformer winding deformation, etc. than the short circuit impedance test. This alternative test can be performed without opening the transformer and without a large AC power source. As shown in FIG. 1, transformer 10 is removed from service and a signal source 12 such as a recurrent surge generator is electrically connected to one of the transformer's input windings 14. A current shunt 16 is electrically connected to the transformer's input winding (as shown) or another winding (not shown). A recording device 18 such as a digital oscilloscope is electrically connected to the input winding and the output of the current shunt. Actuation of signal source 12 applies a test signal to input winding 14, producing a current in the input winding to which current shunt 16 is connected or, if current shunt 16 is connected in the output winding, a capacitively coupled current signal. Alternatively the current shunt is disconnected and the voltage coupled into the output winding is measured. Both the applied signal and the resultant capacitively coupled signal are recorded by recording device 18, and the data so obtained is then used to calculate a transfer function for the transformer, in conventional fashion. The data and/or transfer function are retained for future comparison with additional data and/or transfer function(s) obtained during subsequent testing of the same transformer under identical test conditions. The comparison can also be done with another transformer of identical design; although such comparisons are not as accurate as comparisons of test results obtained for the same transformer over time. The objective is to detect differences between transfer functions obtained at different testing times, with such differences possibly being indicative of transformer winding movement, etc.

Either one of two different test methods can be used to perform the frequency response analysis test to obtain the desired transfer function; namely, the swept frequency test method or the pulse test method. A swept frequency test is performed by applying a variable frequency voltage or a white noise voltage input signal to the transformer's high voltage winding terminal (normally the input winding terminal) and recording the output response signal produced in another winding terminal (normally the output winding terminal) of the transformer. The output signal divided by the input signal for each test frequency yields the transformer's transfer function as a function of frequency. A pulse test is performed by applying an input pulse signal containing energy at all frequencies of interest to the input winding, and recording the output response signal produced in another winding (normally the output winding). The recorded data (applied voltage input and capacitively coupled current output signal) are then each subjected to a Fourier transform. The Fourier transform of the capacitively coupled current output signal is divided by the Fourier transform of the applied voltage input signal to obtain the transformer's transfer function as a function of frequency.

The input and output signals can be measured on any combination of input and output terminals of the transformer. All combinations will have some sensitivity to transformer winding deformation, etc. Normally, the most sensitive measurement is obtained using the high voltage winding for the input signal and the low voltage winding for the output signal. Other combinations are sometimes used e.g. input to high voltage winding and output on neutral to obtain more information, or due to transformer design limitations.

A transformer's transfer function is independent of the applied signal source, but dependent upon the transformer's internal structure. More particularly, a combination of factors including winding inductances and winding capacitances (inter-turn capacitance, interwinding capacitance, winding-to-tank capacitance, etc.) determine the transfer function. Any movement, looseness, deformation or distortion of a transformer's windings can change the transformer's capacitance characteristics, thereby changing the transformer's transfer function. By carefully comparing a transfer function obtained via testing while a transformer is in a known satisfactory operating condition with a transfer function obtained via later testing of the same transformer, one may detect changes indicative of transformer winding movement, etc. The higher the maximum frequency of the transfer function, the more sensitive the test is to winding movement.

Figure 2:
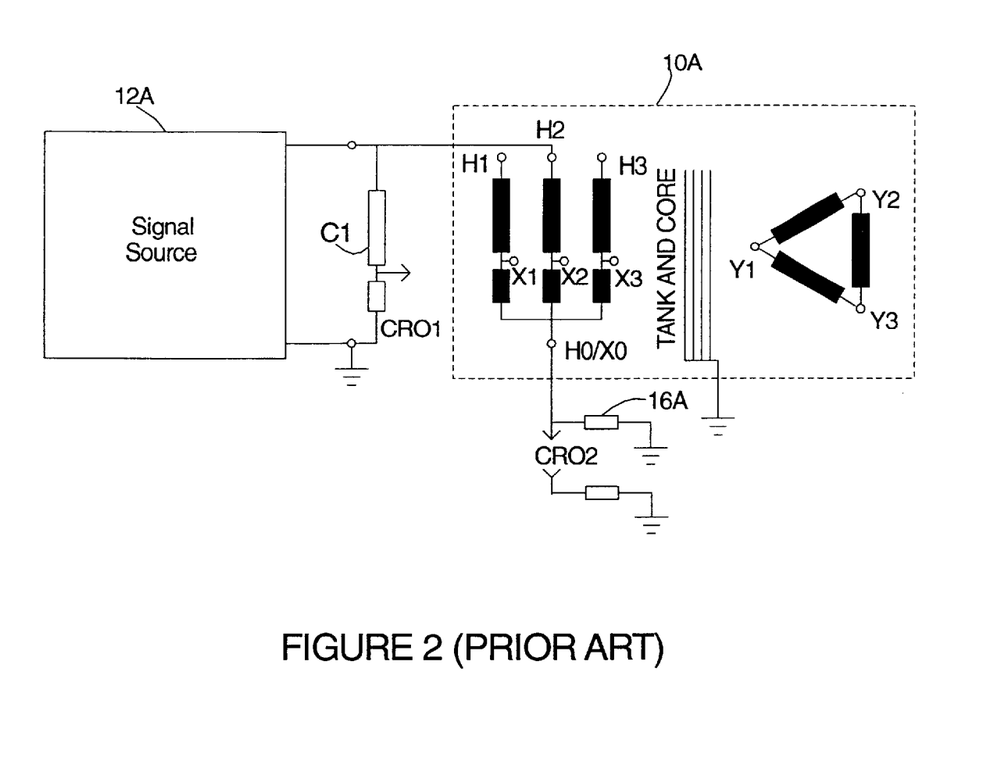
FIG. 2 is an electrical circuit schematic diagram showing a transformer configured for testing in accordance with a prior art frequency response analysis technique using a pulse testing method.

FIG. 2 provides further details of the prior art frequency response analysis test using the pulse test method. A signal source such as a recurrent surge generator 12A is used to apply a pulse of about 300 volts to each one of transformer 10A's input winding terminals in turn. The transformer's neutral terminal H0/X0 and the corresponding tertiary winding terminals Y1, Y2, Y3 are in turn grounded through current shunt 16A. This represents the measurements normally done on an auto-transformer having a tertiary winding. There are many other transformer winding configurations that can be tested (e.g. single phase dual winding, three phase dual winding, etc.). Other test configurations can be used for transformer 10A, but the six measurements described above and tabulated below are the most common:

| Input | Shunt |
|---|---|
| H1 | H0/X0 |
| H1 | Y1 |
| H2 | H0/X0 |
| H2 | Y2 |
| H3 | H0/X0 |
| H3 | Y3 |

The applied voltage CR01 and the voltage CR02 across current shunt 16A (representative of the winding current or the current which is capacitively coupled into the secondary winding) are recorded on recording device (digital oscilloscope) 18.

Besides the aforementioned dependence upon internal structure, a transformer's transfer function is also critically dependent upon the physical characteristics of the leads used to connect the applied signal source, current shunt and recording instrumentation to the transformer. Therefore, to facilitate comparison of transfer functions obtained via tests conducted at different times, a careful record of the test measurement setup (FIG. 3) is retained, together with accurate measurements of: the length and wire gauge of each of leads L1 through L6; the model, length, voltage division ratio, and input impedance of voltage probe C1 (typically provided as an accessory to digital oscilloscope 18); the length, impedance and cable type of coaxial cables C2, C3; and, the model and impedance of current shunt 16A. In subsequent testing of the same transformer an identical test measurement setup, identical lead lengths, etc. must be employed to facilitate meaningful comparison of transfer functions obtained via tests conducted at different times. It is noteworthy that the lengths of leads L1–L6 and coaxial cables C2, C3 depend upon the size of the transformer being tested, and can be 20 metres or longer. (In order to obtain the H0/X0 measurement, the FIG. 3 setup is modified by disconnecting lead L1 and connecting lead L5 to the input of current shunt 16A.

Figure 3:
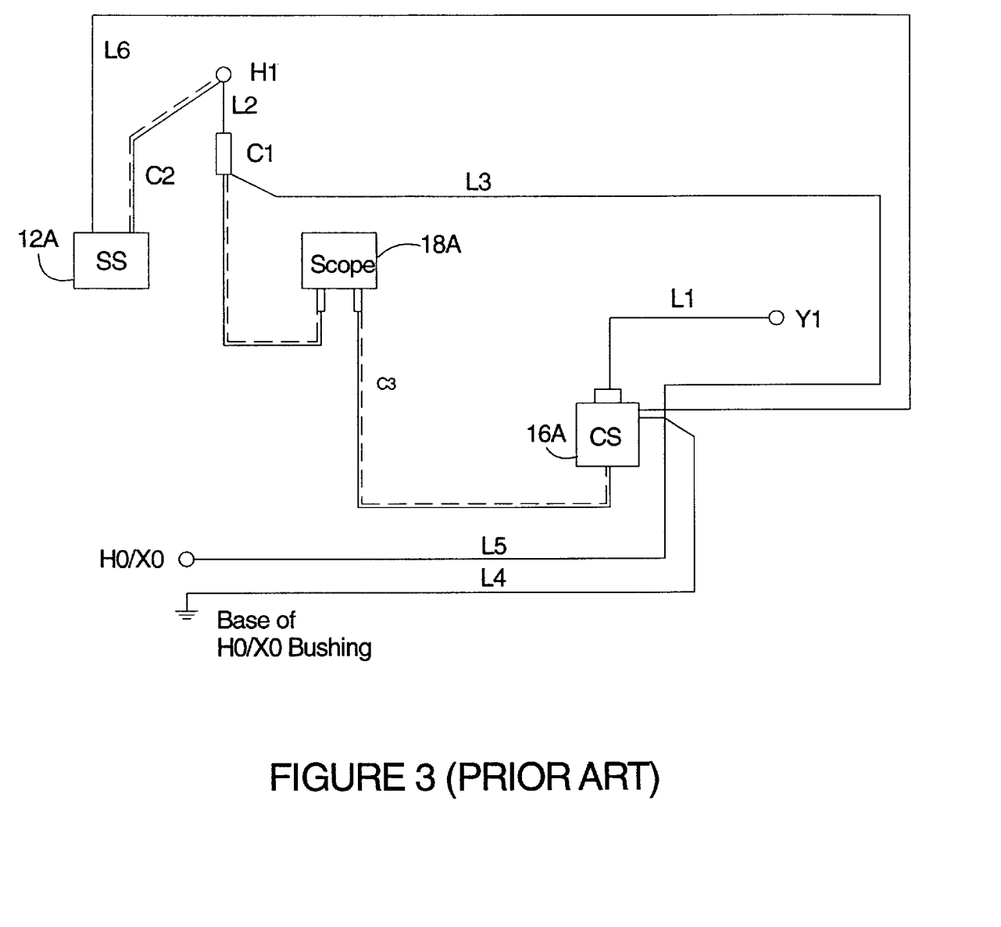
FIG. 3 is an electrical circuit schematic diagram showing the test measurement setup for conducting a prior art frequency response analysis test.

Any test which employs external leads (i.e. leads L1 to L6 as shown in FIG. 3) is subject to a frequency range limitation (about 3 MHz for the pulse test method) due to the leads' impedance and due to the sensitivity of lead positioning at higher signal frequencies. More particularly, at high frequencies the lengthy external leads have high impedance resulting in significant signal attenuation and noise; and, the leads' positions (which can not be exactly duplicated for different tests) affects the test results. Even a slight change in lead position affects high frequency test results. Due to the physical size of the transformer and its bushings, it is not possible to shorten the leads to improve the frequency response. Consequently, prior art frequency response analysis techniques are comparatively useless at higher signal frequencies.

Figure 8:
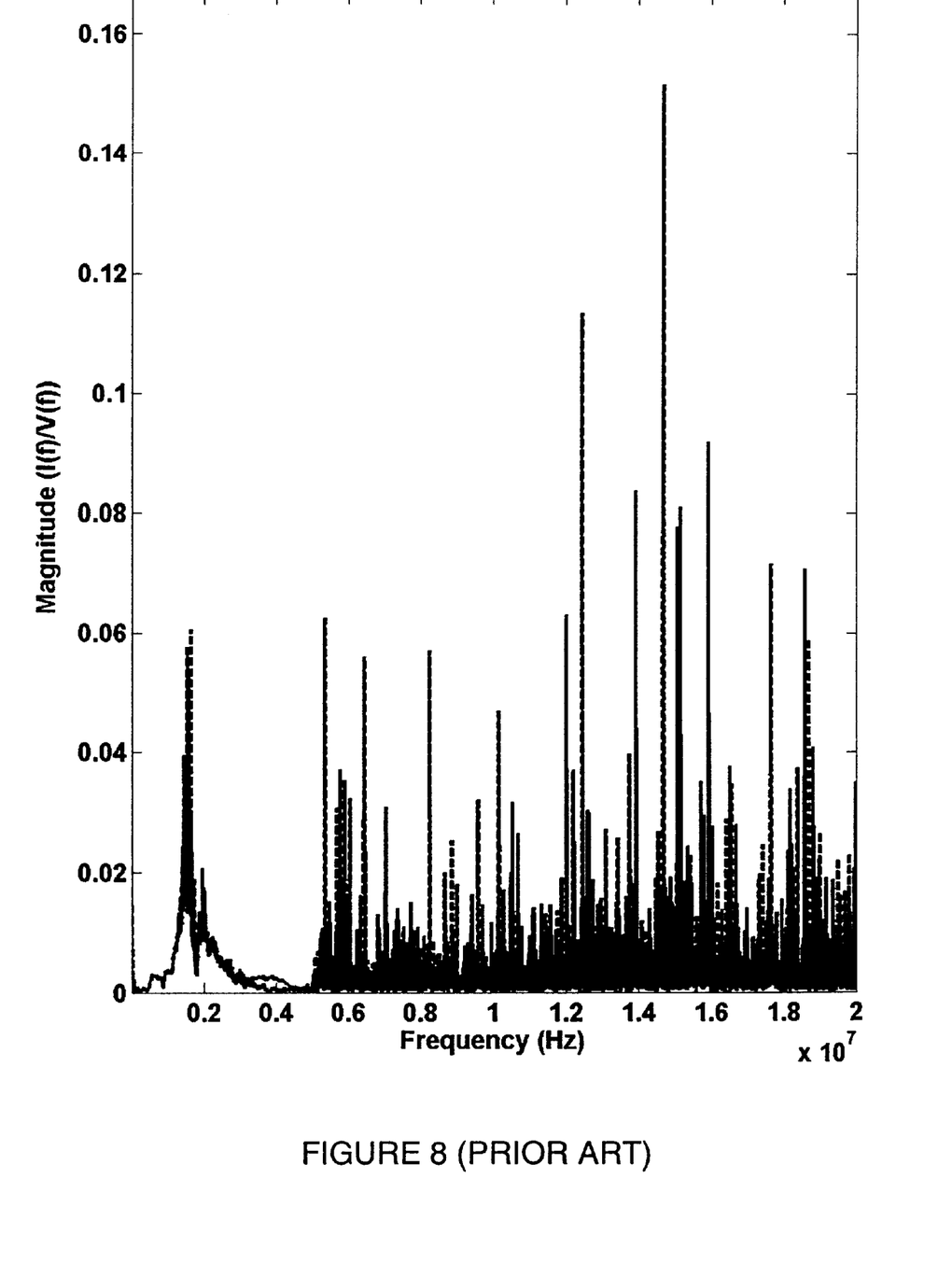
FIG. 8 graphically depicts a transformer's transfer function based on data obtained by testing in accordance with a prior art frequency response analysis or low voltage impulse test. The dashed line transform depicts the transformer's "normal" operating condition; the solid line transform depicts the same transformer after subjecting its windings to a minor movement.
Figure 9:
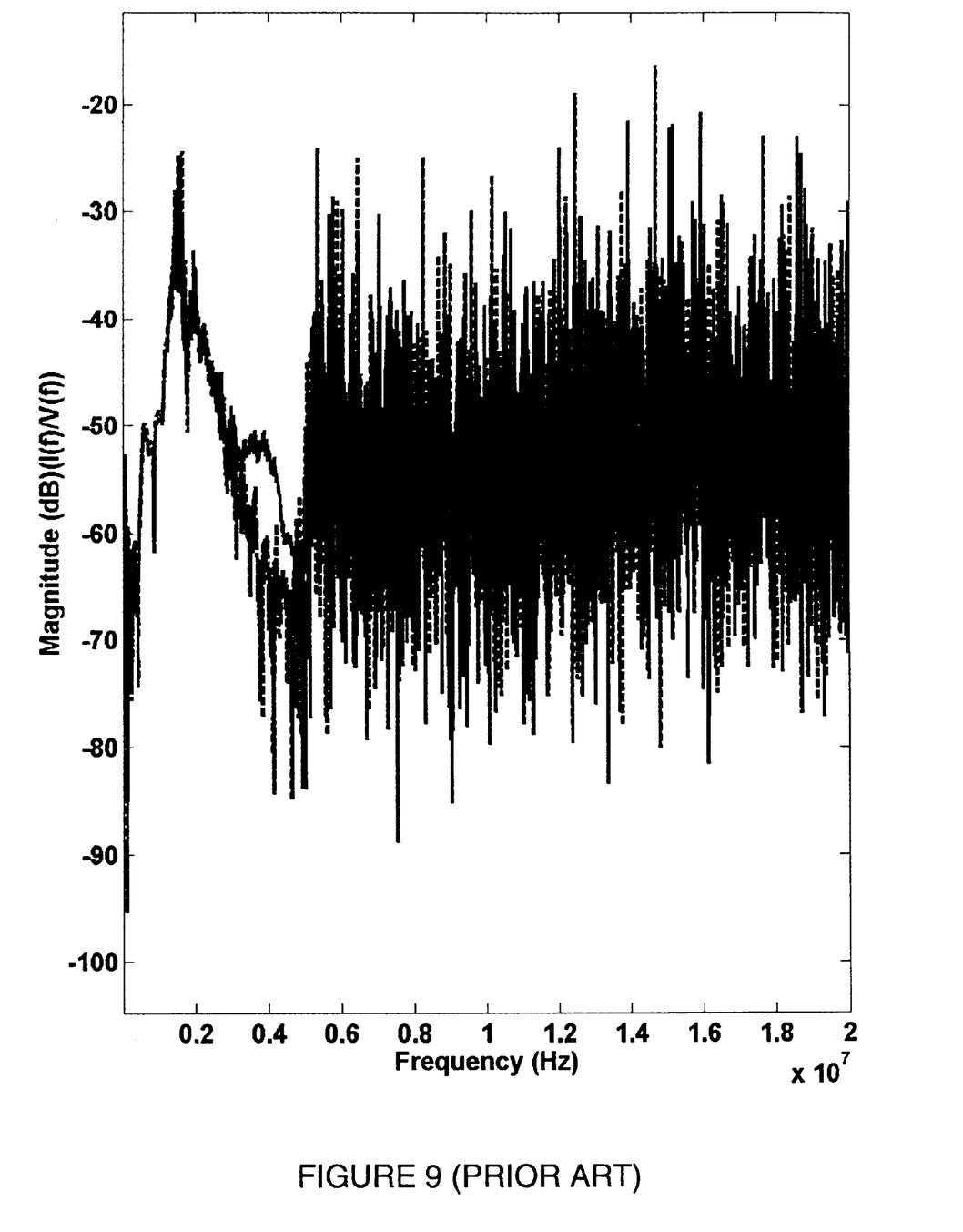
FIG. 9 presents the same data as FIG. 8, utilizing a decibel (dB) ordinate (magnitude) scale.

This is illustrated by FIGS. 8 and 9, which reveal that neither linear nor dB plots are adequate to enable useful discrimination between transfer functions derived from data measurements obtained during "normal" operating conditions and after subjecting the same transformer's windings to minor movement. At higher frequencies the two plots appear to substantially overlap, which could cause inaccurate interpretation of the solid line transfer function as representative of acceptably normal operation, notwithstanding the fact that the data from which the solid line transfer function was obtained reflects winding movement as aforesaid.

The invention avoids the above disadvantages by providing a measurement technique which requires neither external leads nor removal of the transformer from service, is highly sensitive to the effects of transformer winding movement, etc. and readily facilitates transfer function discrimination of such effects at high signal frequencies.

SUMMARY OF INVENTION

The invention facilitates detection of transformer winding movement by providing an input sensor inside the transformer on an input winding lead and providing an output sensor inside the transformer on an output winding lead. This eliminates the frequency limitation imposed by the lead lengths required for prior art external measurement, making it possible to obtain useful measurements at much higher frequencies (20 MHz) than with the prior art techniques. Both sensors are electrically connected to a signal recorder provided outside the transformer via high bandwidth cables which extend through the transformer's casing.

During a first test interval and while the transformer is in a known satisfactory operating condition, a first test signal is applied to the input winding lead while recording on the signal recorder (i) a first output signal, produced by the input sensor, representative of the first test signal, and (ii) a second output signal, produced by the output sensor, representative of the first test signal after coupling of the first test signal through a winding of the transformer to the output winding lead. During a second test interval and while the transformer is in an unknown operating condition, a second test signal is applied to the input winding lead while recording on the signal recorder (i) a third output signal, produced by the input sensor, representative of the second test signal, and (ii) a fourth output signal, produced by the output sensor, representative of the second test signal after coupling of the second test signal through a winding of the transformer to the output winding lead. The first and second signals are combined to produce a first transfer function representative of operation of the transformer during the first test interval; and, the third and fourth signals are combined to produce a second transfer function representative of operation of the transformer during the second test interval. The first and second transfer functions are then compared to detect differences between them.

The test signals preferably include energy at signal frequencies throughout the range of about 1 KHz to about 20 MHz. The signal source that produces the test signals may be a recurrent surge generator provided outside the transformer. Alternatively, the test signal may be a voltage transient produced by disconnecting a circuit breaker in the power system energizing the transformer; or, the test signal may be received through antenna coupling to a power transmission line in the power system.

The output sensor may be a capacitive voltage sensor, an (optical or electrical) electric field sensor, or a (optical or electrical) high frequency current transformer, a Rogowski coil, an optical current transducer, or any other sensor capable of measuring the electric field, voltage, current or magnetic field at the internal winding leads.

DESCRIPTION

Figure 4:
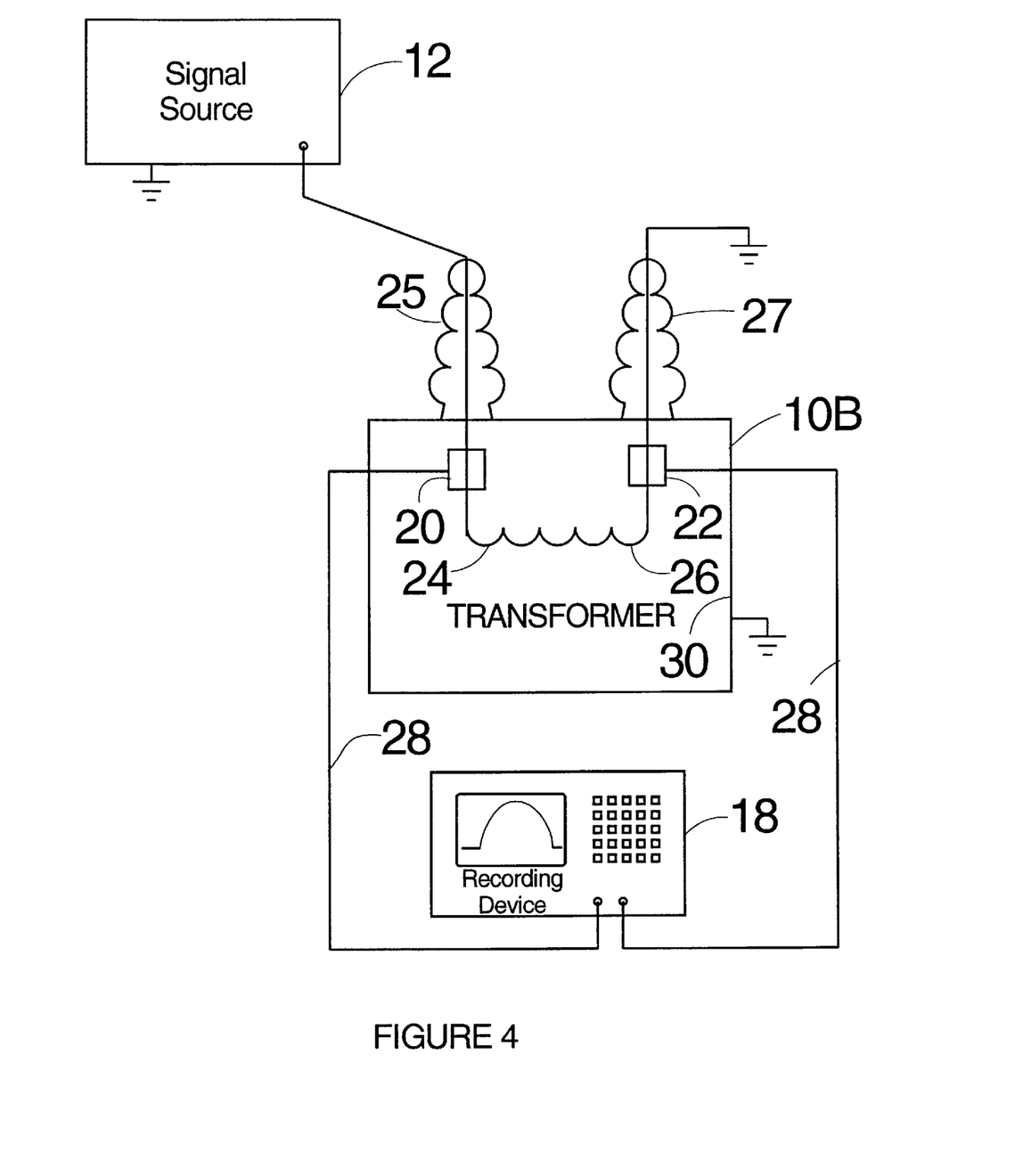
FIG. 4 is a block diagram showing a transformer configured for testing in accordance with the invention.

As shown in FIG. 4, the invention eliminates external leads L1 to L6, and facilitates signal measurement at the transformer windings themselves, not at a point of external lead connection to the transformer as in the above-described prior art techniques. Signals are directly measured within transformer 10B by input and output sensors 20, 22 which are mounted inside transformer 10B on winding leads 24, 26 respectively such that the input and output signals are measured at the transformer windings, not at the bushing input terminals. This eliminates loss of sensitivity due to high frequency signal attenuation caused by the impedance of bushings 25, 27 and of leads L1 to L6. The measurement signals produced by sensors 20, 22 are transferred outside transformer 10B by high bandwidth fiber optic or coaxial cables 28, eliminating the need for long bare wires such as prior art leads L1 to L6 which introduce signal attenuation, noise, and high frequency positioning factors, as previously discussed. Placement of sensors 20, 22 inside transformer 10B makes it possible to reduce the sensors' size due to the insulating properties of the oil within transformer 10B, resulting in improved high frequency response.

Input sensor 20 detects the signal applied by signal source 12 to input winding lead 24, whereas the prior art method depicted in FIG. 1 detects the applied signal as much as five metres away at the point of lead connection to the transformer's input bushing stack 25. Sensor 20 couples to recording instrument 18 (for example, a digital oscilloscope) a "first" signal representative of such detected applied signal. Output sensor 22 detects the resultant voltage or current signal which is capacitively coupled to output winding lead 26, whereas the prior art method depicted in FIG. 1 detects the resultant signal as much as three metres away at the point of connection to the transformer's output bushing stack 27. Sensor 22 couples to recording instrument 18 a "second" signal representative of such detected resultant signal. If it is desired to measure voltage signals capacitively coupled to output winding lead 26, then output sensor 22 may be either a capacitive voltage sensor or an optical (or electrical) electric field sensor.

Figure 5:
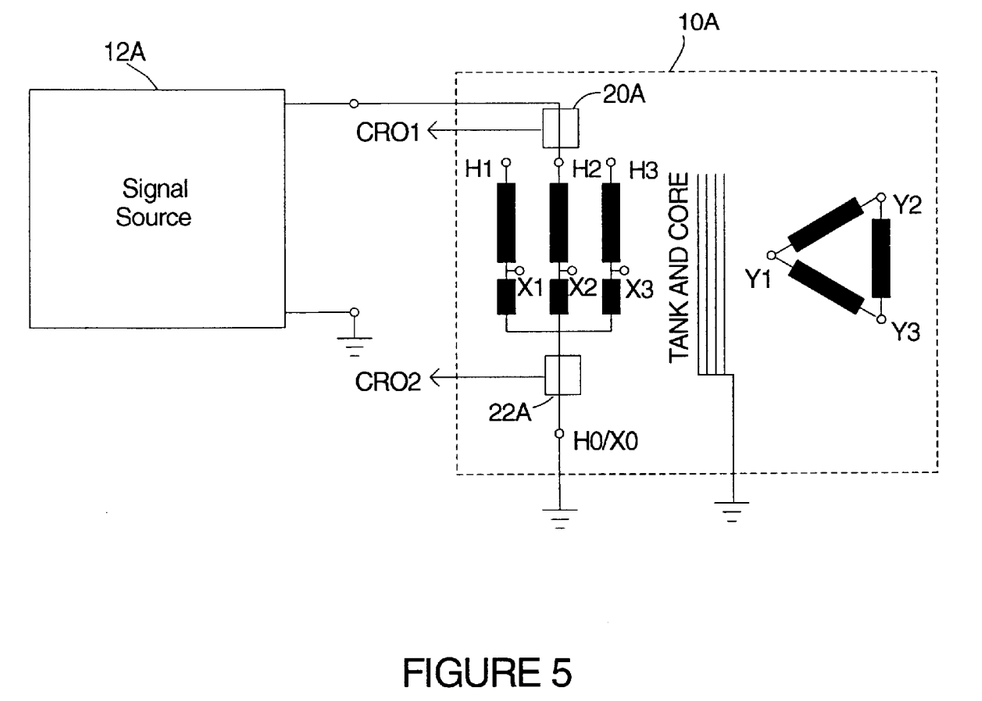
FIG. 5 is an electrical circuit schematic diagram showing a transformer configured for testing in accordance with the invention.

As shown in FIG. 5, a signal source such as a recurrent surge generator 12A is used to apply a pulse of about 300 volts to each one of transformer 10A's input winding terminals in turn. As previously explained, the transformer's neutral terminal H0/X0 and the corresponding tertiary winding terminals Y1, Y2, Y3 are in turn grounded and the above-tabulated six measurements are recorded. The output voltages CR01 and CR02 produced by sensors 20A, 22A respectively are recorded on recording device (digital oscilloscope) 18.

If output sensor 22 is an electric field sensor, then it must be carefully positioned such that its output signal is always directly proportional to voltage. Output sensor 22 must be mounted such that any internal movement will not cause the sensor to move relative to the winding lead. For example, if vibration of transformer 10B caused the position of the electric field sensor to move relative to the winding lead, the sensor output signal would change, even if the voltage to be measured was fixed. More particularly, the electric field around the winding lead is highest at the conductor surface and decreases as a function of distance away from the conductor. If, for example, the electric field sensor is mounted 2 mm away from the surface of the conductor, the electric field (and therefore the sensor output) would be higher than if the sensor were mounted 4 mm away from the surface of the conductor, for a given input voltage. Therefore, if the sensor position changed (moved further away) over time, the sensor output signal would also change, even if the voltage (which produces the electric field) had not changed. This would cause a false indication of change in the transfer function.

If it is desired to measure current signals capacitively coupled to output winding lead 26, then output sensor 22 may be an electrical (or optical) high frequency current transformer, a Rogowski coil, an optical current transducer, or any other sensor capable of measuring the electric current at output winding lead 26. Either or both of sensors 20, 22 may be wireless transmit/receive type devices. As in the case of output sensor 22, input sensor 20 may be either a capacitive voltage sensor or an optical (or electrical) electric field sensor; or, current signals capacitively coupled to input winding lead 24 can be measured if input sensor 20 is an electrical (or optical) high frequency current transformer, a Rogowski coil, an optical current transducer, or any other sensor capable of measuring the electric current at input winding lead 24.

If the "second" signal produced by output sensor 22 is an electrical signal then cable 28 connected through transformer tank wall 30 between sensor 22 and recording instrument 18 may be a coaxial cable. If sensor 22 produces an optical output signal, then cable 28 may be a fibre optic cable and a suitable converter (not shown) can be provided to convert the optical signal into an electrical form suitable for input to recording instrument 18.

Signal source 12 may be any one of a variety of sources capable of producing a signal containing measurable energy levels throughout the frequency range of interest. For example, signal source 12 can be a swept frequency source or a pulse source of the type utilized in the previously described prior art frequency response analysis methods. Alternatively, voltage transients of the type caused by normal power system circuit breaker connect/disconnect operations can be used as the input signal source. As a further alternative, signals which the transmission line conductors coupled to the transformer normally receive due to their inherent antenna characteristics can be used as the input signal source. Since transformer winding movement, etc. is detected by comparison of transfer functions (which are independent of applied signal source), the input test signals need not be identical for both the initial and subsequent tests.

Figure 6:
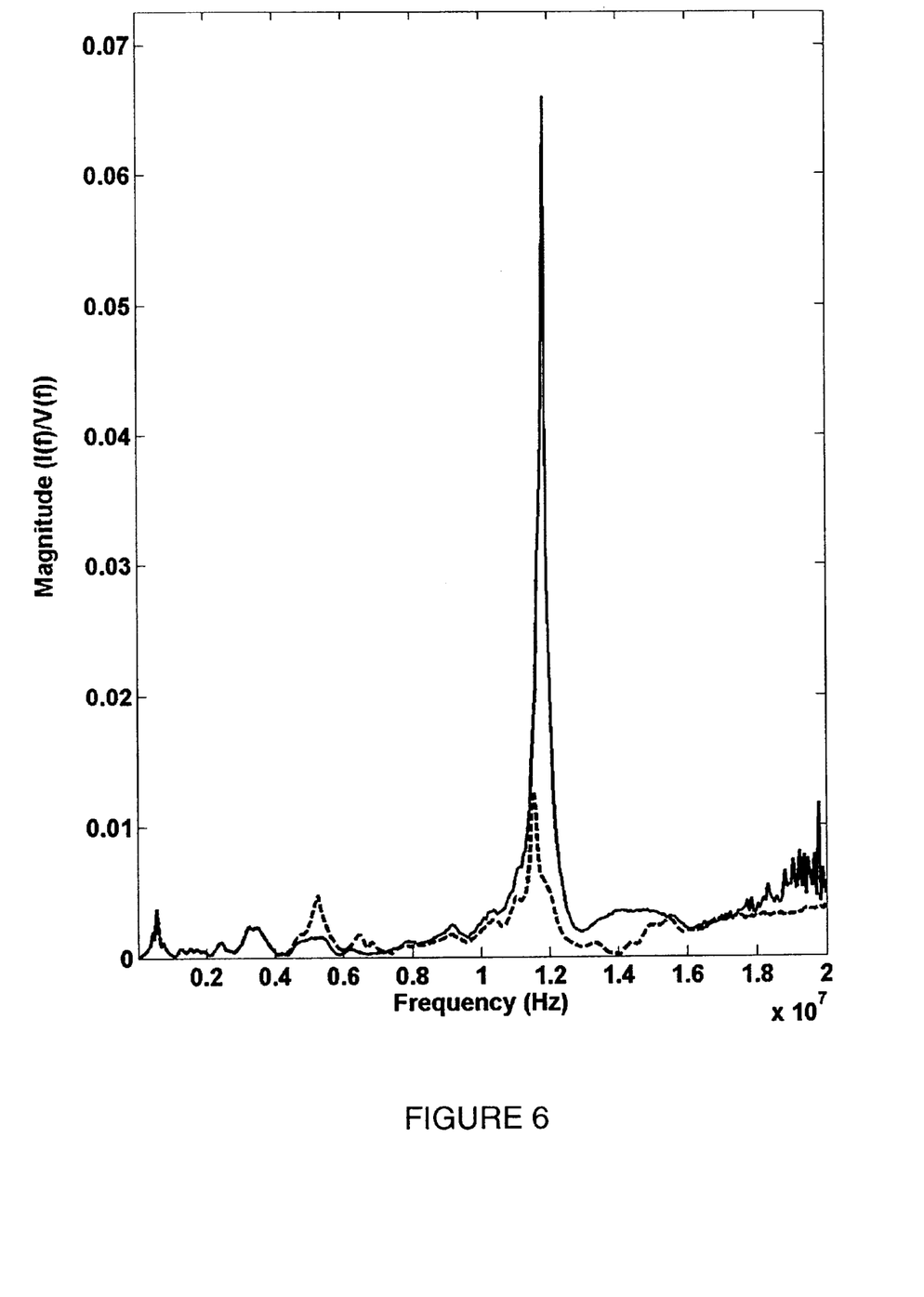
FIG. 6 graphically depicts a transformer transfer function (Fourier transform of current capacitively coupled in output winding divided by Fourier transform of voltage applied to input winding, as a function of frequency) based on data obtained by testing in accordance with the invention. The dashed line transform depicts the transformer's "normal" operating condition; the solid line transform depicts the same transformer after subjecting its windings to a minor movement.
Figure 7:
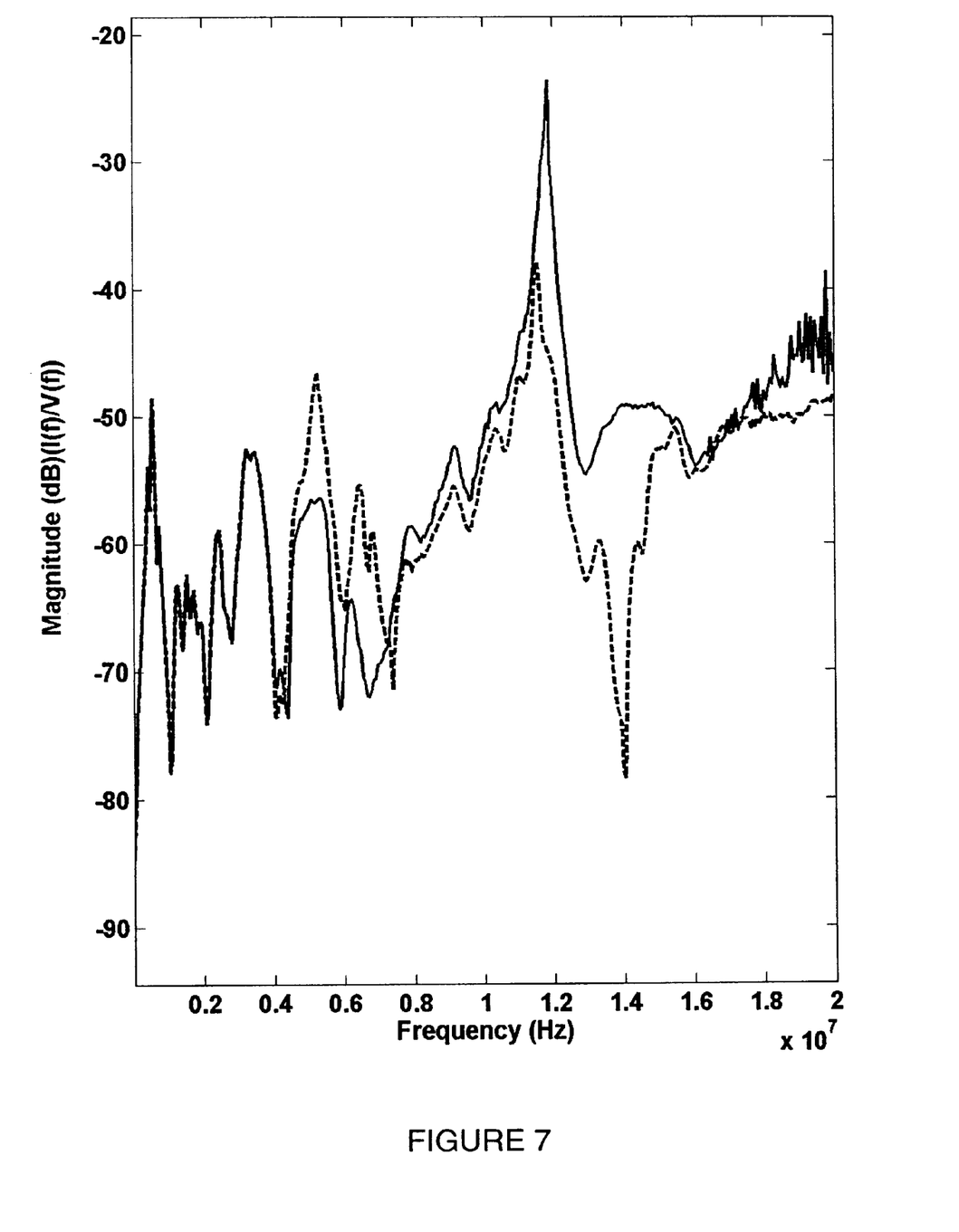
FIG. 7 presents the same data as FIG. 6, utilizing a decibel (dB) ordinate (magnitude) scale.

FIGS. 6 and 7 respectively provide linear and dB plots of the 0–20 MHz transfer function measured, in accordance with the invention, with (solid line transform) and without (dashed line transform) minor winding movement. It can be seen that there is no significant difference in the transfer function below about 1 kHz. However, substantial differences between the two transforms are revealed at frequencies exceeding 4 MHz, including some particularly notable spike-type differences at about 5.5, 12 and 14 MHz. Any differences are significant, but such spikes are typically indicative of a resonant frequency in the transformer and usually occur in regions which exhibit the greatest differences. By contrast, neither the linear nor the dB transfer function plots of FIGS. 8 and 9 (derived from data obtained by testing, in accordance with the prior art frequency response analysis method, the same transformer under conditions identical to those used to obtain the data for FIGS. 6 and 7) exhibit no practically useful discernible differences.

Although the input signals used for each test preferably include energy at signal frequencies throughout the range of about 1 kHz to about 20 MHz, a narrower range can be used at the potential expense of reduced sensitivity. The optimum frequency range is different for different transformers, with 0.5 to 2 MHz; 10 to 15 MHz; and other higher frequency bands above 20 MHz being sensitive bands for purposes of detecting transformer winding movement, etc.

Measuring the signals inside of the transformer eliminates the frequency limitation imposed by the lead length required for external measurement, making it possible to obtain useful measurements at higher frequencies (20 MHz). Higher frequency measurements enable detection of much smaller winding movements, thus providing earlier warning of changes in the transformer. Permanent mounting of sensors 20, 22 inside transformer 10B eliminates the risk of test set-up variation when measurements are taken at different times; and, makes it easier to do the test, thereby reducing costs and rendering more frequent testing and closer monitoring of the transformer's performance feasible. The capability to use signals generated by the power system itself means that the test can be done without disconnecting the transformer from service more feasibly than in the case of the prior art methods.

As will be apparent to those skilled in the art in the light of the foregoing disclosure, many alterations and modifications are possible in the practice of this invention without departing from the spirit or scope thereof. For example:

the input signal could be coupled into the transformer through the bushing capacitance tap;

the applied impulse or swept frequency signal or white noise signal could be coupled into the transformer input through a coupling capacitor;

a Gaussian or other type of random noise signal could be used as the input signal source, instead of a pulse or swept frequency or white noise signal;

sensors 20, 22 could be mounted somewhere on the winding instead of (or in addition to) on input/output winding leads 24, 26;

sensors 20, 22 could be placed on tap changer leads instead of (or in addition to) on input/output winding leads 24, 26;

the measurement signals produced by sensors 20, 22 could be processed inside the transformer, with only the resultant transfer function being transferred as a digital signal outside of the transformer; and, all signal processing, including comparison with previous measurements, could be done inside the transformer, with only an indication of change being transmitted outside the transformer.

Accordingly, the scope of the invention is to be construed in accordance with the substance defined by the following claims.

What is claimed is:

1. Apparatus for detecting transformer winding movement, comprising:
   (a) an input sensor inside said transformer on an input winding lead of said transformer, said input sensor producing a first output signal representative of a test signal applied to said input winding lead; and,
   (b) an output sensor inside said transformer on an output winding lead of said transformer, said output sensor producing a second output signal representative of said test signal after coupling of said test signal through a winding of said transformer to said output winding lead.

2. Apparatus as defined in claim 1, further comprising a signal recorder outside said transformer, and wherein said signal recorder is electrically connected to said input and output sensors by leads passing through a casing of said transformer.

3. Apparatus as defined in claim 1, wherein said test signal includes energy at signal frequencies throughout the range of about 1 kHz to about 20 MHz.

4. Apparatus as defined in claim 1, wherein said test signal is a voltage transient produced by disconnecting a circuit breaker in a power system energizing said transformer.

5. Apparatus as defined in claim 1, wherein said test signal is received by antenna coupling to a power transmission line in a power system energizing said transformer.

6. Apparatus as defined in claim 1, wherein said output sensor is a capacitive voltage sensor.

7. Apparatus as defined in claim 1, wherein said output sensor is a Rogowski coil.

8. Apparatus as defined in claim 1, further comprising a signal source outside said transformer, said signal source producing said test signal.

9. Apparatus as defined in claim 8, wherein said signal source is a recurrent surge generator.

10. Apparatus as defined in claim 1, wherein said output sensor is an electric field sensor.

11. Apparatus as defined in claim 10, wherein said electric field sensor produces an optical output signal.

12. Apparatus as defined in claim 1, wherein said output sensor is a high frequency current transformer.

13. Apparatus as defined in claim 12, wherein said high frequency current transformer produces an optical output signal.

14. A method of detecting transformer winding movement, comprising:
   (a) during a first test interval and while said transformer is in a known satisfactory operating condition:
      (i) applying a first test signal to an input winding lead of said transformer;
      (ii) detecting, inside said transformer and on said input winding lead, a first output signal representative of said first test signal;
      (iii) detecting, inside said transformer and on an output winding lead of said transformer, a second output signal representative of said first test signal after coupling of said first test signal through a winding of said transformer to said output winding lead;
      (iv) recording said first and second output signals;
   (b) during a second test interval and while said transformer is in an unknown operating condition:
      (i) applying a second test signal to said input winding lead of said transformer;
      (ii) detecting, inside said transformer and on said input winding lead, a third output signal representative of said second test signal;
      (iii) detecting, inside said transformer and on an output winding lead of said transformer, a fourth output signal representative of said second test signal after coupling of said second test signal through a winding of said transformer to said output winding lead;
      (iv) recording said third and fourth output signals;
   (c) combining said first and second signals to produce a first transfer function representative of operation of said transformer during said first test interval;
   (d) combining said third and fourth and second signals to produce a second transfer function representative of operation of said transformer during said second test interval; and,
   (e) comparing said first and second transfer functions to detect differences therebetween.

15. A method as defined in claim 14, wherein said first and second test signals each include energy at signal frequencies throughout the range of about 1 kHz to about 20 MHz.

16. A method as defined in claim 14, wherein said first and second test signals are voltage transients produced by disconnecting a circuit breaker in a power system energizing said transformer.

17. A method as defined in claim 14, wherein said first and second test signals are received by antenna coupling to a power transmission line in a power system energizing said transformer.

18. A method as defined in claim 14, wherein said output sensor is a capacitive voltage sensor.

19. A method as defined in claim 14, wherein said output sensor is an electric field sensor.

20. A method as defined in claim 19, wherein said electric field sensor produces an optical output signal.

21. A method as defined in claim 14, wherein said output sensor is a Rogowski coil.

22. A method as defined in claim 14, wherein said output sensor is a high frequency current transformer.

23. A method as defined in claim 22, wherein said high frequency current transformer produces an optical output signal.

24. A method of detecting transformer winding movement, comprising:
   (a) providing an input sensor inside said transformer on an input winding lead of said transformer;
   (b) providing an output sensor inside said transformer on an output winding lead of said transformer;
   (c) electrically connecting said input sensor and said output sensor to a signal recorder provided outside said transformer;
   (d) during a first test interval and while said transformer is in a known satisfactory operating condition, applying a first test signal to said input winding lead while recording on said signal recorder:
      (i) a first output signal, produced by said input sensor, representative of said first test signal;
      (ii) a second output signal, produced by said output sensor, representative of said first test signal after coupling of said first test signal through a winding of said transformer to said output winding lead;
   (e) during a second test interval and while said transformer is in an unknown operating condition, applying a second test signal to said input winding lead while recording on said signal recorder:
      (i) a third output signal, produced by said input sensor, representative of said second test signal;
      (ii) a fourth output signal, produced by said output sensor, representative of said second test signal after coupling of said second test signal through a winding of said transformer to said output winding lead;
   (f) combining said first and second signals to produce a first transfer function representative of operation of said transformer during said first test interval;
   (g) combining said third and fourth signals to produce a second transfer function representative of operation of said transformer during said second test interval; and,
   (h) comparing said first and second transfer functions to detect differences therebetween.

25. A method as defined in claim 24, wherein said first and second test signals each include energy at signal frequencies throughout the range of about 1 kHz to about 20 MHz.

26. A method as defined in claim 24, wherein said first and second test signals are voltage transients produced by disconnecting a circuit breaker in a power system energizing said transformer.

27. A method as defined in claim 24, wherein said first and second test signals are received by antenna coupling to a power transmission line in a power system energizing said transformer.

28. A method as defined in claim 24, wherein said output sensor is a capacitive voltage sensor.

29. A method as defined in claim 24, wherein said output sensor is a Rogowski coil.

30. A method as defined in claim 24, wherein said output sensor is an electric field sensor.

31. A method as defined in claim 30, wherein said electric field sensor produces an optical output signal.

32. A method as defined in claim 24, wherein said output sensor is a high frequency current transformer.

33. A method as defined in claim 32, wherein said high frequency current transformer produces an optical output signal.

* * * * *